US010266961B2

(12) United States Patent
Sudo et al.

(10) Patent No.: US 10,266,961 B2
(45) Date of Patent: Apr. 23, 2019

(54) SILICA GLASS CRUCIBLE AND METHOD FOR PRODUCING MONOCRYSTALLINE SILICON USING SAME

(71) Applicant: SUMCO CORPORATION, Minato-ku, Tokyo (JP)

(72) Inventors: Toshiaki Sudo, Akita (JP); Tadahiro Sato, Akita (JP); Eriko Kitahara, Akita (JP); Takeshi Fujita, Akita (JP)

(73) Assignee: SUMCO CORPORATION, Tokyo (JP)

( * ) Notice: Subject to any disclaimer, the term of this patent is extended or adjusted under 35 U.S.C. 154(b) by 589 days.

(21) Appl. No.: 14/369,159

(22) PCT Filed: Oct. 31, 2012

(86) PCT No.: PCT/JP2012/078258
§ 371 (c)(1),
(2) Date: Jun. 26, 2014

(87) PCT Pub. No.: WO2013/099432
PCT Pub. Date: Jul. 4, 2013

(65) Prior Publication Data
US 2014/0352606 A1   Dec. 4, 2014

(30) Foreign Application Priority Data

Dec. 30, 2011  (JP) ................................. 2011290479
Dec. 30, 2011  (JP) ................................. 2011290480

(51) Int. Cl.
C30B 15/10   (2006.01)
C30B 29/06   (2006.01)
C30B 15/20   (2006.01)

(52) U.S. Cl.
CPC .............. *C30B 15/10* (2013.01); *C30B 15/20* (2013.01); *C30B 29/06* (2013.01); *Y10T 117/1032* (2015.01)

(58) Field of Classification Search
CPC .......... C30B 15/10; C30B 15/20; C30B 29/06; Y10T 117/1032
See application file for complete search history.

(56) References Cited

U.S. PATENT DOCUMENTS

2010/0089308 A1*  4/2010  Kishi ..................... C03C 3/06
                                                                                                117/28
2010/0126407 A1    5/2010  Kishi et al.
(Continued)

FOREIGN PATENT DOCUMENTS

JP    10264922 A   * 10/1998
JP    10264922 A   * 10/1998
(Continued)

OTHER PUBLICATIONS

International Search Report (ISR) for PCT/JP2012/078258; dated Dec. 18, 2012.

*Primary Examiner* — Hua Qi
(74) *Attorney, Agent, or Firm* — Law Office of Katsuhiro Arai (57) ABSTRACT

Buckling of a vitreous silica crucible or fall of a sidewall into the crucible is effectively suppressed. Furthermore, dislocations in a silicon single crystal are suppressed to enhance the yield of the single crystal. The vitreous silica crucible is used to pull single-crystal silicon and includes the cylindrical sidewall having an upward-opening rim, a mortar-shaped bottom including a curve, and a round portion connecting the sidewall and the bottom. The round portion is provided in such a manner that the curvature of the inner surface thereof is gradually increased from the sidewall toward the bottom in a section passing through the rotation axis of the vitreous silica crucible.

2 Claims, 4 Drawing Sheets

(56) References Cited

U.S. PATENT DOCUMENTS

| | | | |
|---|---|---|---|
| 2010/0147213 A1* | 6/2010 | Harada | C03B 19/095 |
| | | | 117/208 |
| 2010/0319613 A1 | 12/2010 | Fujiwara et al. | |
| 2011/0017128 A1* | 1/2011 | Harada | C03B 19/095 |
| | | | 117/208 |
| 2012/0131954 A1* | 5/2012 | Sudo | C03B 19/095 |
| | | | 65/17.3 |

FOREIGN PATENT DOCUMENTS

| | | | | |
|---|---|---|---|---|
| JP | 2007-269533 A | 10/2007 | | |
| JP | 2008-273788 A | 11/2008 | | |
| JP | 2010-275151 A | 12/2010 | | |
| WO | 2009/104532 A1 | 8/2009 | | |
| WO | WO-2011019012 A1 * | 2/2011 | ........... | C03B 19/095 |

* cited by examiner

DRIPS ON ROUND PORTION DURING ARC FUSING

BREAKPOINTS OF FORCE APPLIED TO CRUCIBLE ARE CAUSED BY ABRUPT CHANGES IN CRUCIBLE SHAPE

[FIG.5]
Prior Art

SILICA GLASS CRUCIBLE AND METHOD FOR PRODUCING MONOCRYSTALLINE SILICON USING SAME

TECHNICAL FIELD

The present invention relates to a vitreous silica crucible and a method for producing single-crystal silicon using the same.

BACKGROUND ART

In recent years, there have been actively developed vitreous silica crucibles which are used to pull a silicon single crystal and can, with a simple structure, prevent the upper end of the straight body portion thereof from falling inward. As an example of this type of technology, Patent Document 1 discloses a vitreous silica crucible which is used to pull a silicon single crystal and which has a circular groove on the perimeter of the straight body portion thereof and above the initial melt line. This groove is provided in a position below the upper end of a carbon susceptor.

Figure 5:
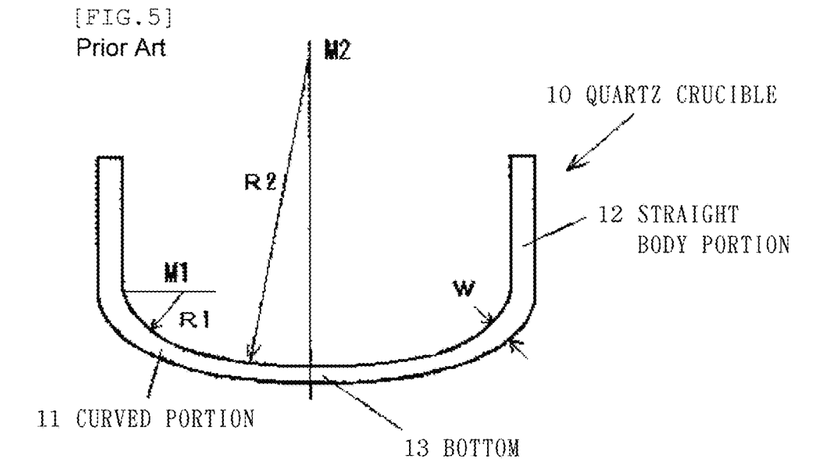
FIG. 5 is a sectional view showing a compound curve formed by the inner surface of a traditional, known vitreous silica crucible.

On the other hand, as shown in FIG. 5, Patent Document 2 discloses that by setting the curvature R1 of the inner wall surface of a curved portion 11 of a crucible to 100 to 240 mm, abrupt changes in the area of the melt surface when the melt surface is lowered are suppressed and that by setting the amount of change of the thickness W of the curved portion 11 of the crucible to 0.1 to 1.2 mm/cm, preferably 0.2 to 0.5 mm/cm, the thermal distribution of the curved portion 11 of the crucible is made uniform. Patent Document 2 then discloses that these methods can suppress polycrystallization of silicon and enhance the yield of the single crystal.

PRIOR ART REFERENCE

Patent Document

[Patent Document 1] Japanese Unexamined Patent Application Publication No. 2008-273788
[Patent Literature 2] Japanese Unexamined Patent Application Publication No. 2007-269533

SUMMARY OF THE INVENTION

Problems to be Solved by the Inventions

However, the traditional technologies disclosed in the above documents have room for improvement in the following respects.

First, for the vitreous silica crucible disclosed in Patent Document 1, if the user himself or herself provide a susceptor for holding the vitreous silica crucible or if the user himself or herself determines the amount of polycrystalline silicon to be charged into the vitreous silica crucible, it may not be possible to previously form a circular groove in a position above the initial melt line and below the upper end of the carbon susceptor.

Second, in the vitreous silica crucible disclosed in Patent Document 2, the inner surface of the inner surface of the crucible forms a compound curve and thus the curvature of the inner surface significantly changes at the junction of the straight body portion 17 and the curved portion 11. The curvature at the inner surface also significantly changes at the junction of the curved portion 11 and the bottom 13. For this reason, the pressure applied to the curved portion 11 may abruptly change at these junctions, thereby causing buckling of the vitreous silica crucible or fall of the straight body portion into the crucible. Furthermore, when waves occur on the surface of the silicon melt at these junctions, dislocations may occur in the silicon single crystal.

On the other hand, semiconductor chip manufacturing processes where 300 mm-diameter wafers are used have gone mainstream in recent years. Processes where 450 mm-diameter wafers are used are also being developed. To manufacture such wafers, a crucible used in the CZ method, which is used to manufacture a single-crystal silicon ingot, has of course been required to have a large opening diameter of 28 inches (71 cm), 32 inches (81 cm), 36 inches (about 91 cm), or 40 inches (102 cm). The weight of a 102 cm-diameter crucible is as heavy as about 120 kg, and the mass of a silicon melt contained therein is 900 kg or more.

The softening point of vitreous silica is about 1200 to 1300° C. In the CZ method, on the other hand, a silicon single crystal is pulled with a silicon melt maintained at a high temperature of 1450 to 1500° C. over as long as two or more weeks. That is, while the silicon single crystal is pulled, the crucible contains 900 kg or more of the silicon melt having a temperature of about 1500° C. In this case, a heater provided outside the vitreous silica crucible must heat the vitreous silica crucible in order to raise the temperature of the silicon melt to about 1500° C. The heated vitreous silica crucible softens and thus disadvantageously easily buckles or falls.

The pulled silicon single crystal is required to have a purity of 99.999999999% or more. Accordingly, the vitreous silica crucible for pulling silicon single crystal is required not to mix a silica fragment or the like into the silicon single crystal. If the heated vitreous silica crucible softens and thus buckles or falls, a silica fragment may fall, causing a significant problem.

The present invention has been made in view of the foregoing, and an object thereof is to provide a technology which effectively suppresses buckling of a vitreous silica crucible or fall of a sidewall into the crucible. Another object of the present invention is to provide a technology which suppresses dislocations in a silicon single crystal to enhance the yield of the single crystal.

Means for Solving the Problems

The present invention provides a vitreous silica crucible used to pull single-crystal silicon and including a cylindrical sidewall having an upward-opening rim, a mortar-shaped bottom including a curve, and a round portion connecting the sidewall and the bottom. In this vitreous silica crucible, the round portion is provided in such a manner that a curvature of an inner surface thereof is gradually increased from the sidewall toward the bottom in a section passing through a rotation axis of the vitreous silica crucible.

According to this configuration, the round portion is provided in such a manner that the curvature of the inner surface thereof is gradually increased from the sidewall toward the bottom. Thus, when the surface of the silicon melt is lowered to around the round portion in the single-crystal silicon pulling process, variations in the pressure applied to the round portion by the silicon melt are reduced. This is because the curvature of the inner surface of the round portion does not significantly change. Therefore, according to this configuration, buckling of the vitreous silica crucible or fall of the sidewall into the crucible can be effectively suppressed.

The present invention also provides a method for producing single-crystal silicon. The method includes charging polycrystalline silicon into a vitreous silica crucible, heating and fusing the polycrystalline silicon to obtain a silicon melt, and pulling single-crystal silicon from the silicon melt. The vitreous silica crucible used in this production method includes a cylindrical sidewall having an upward-opening rim, a mortar-shaped bottom including a curve, and a round portion connecting the sidewall and the bottom. In this vitreous silica crucible, the round portion is provided in such a manner that a curvature of an inner surface thereof is gradually increased from the sidewall toward the bottom in a section passing through a rotation axis of the vitreous silica crucible.

According to this production method, the round portion is provided in such a manner that a curvature of the inner surface thereof is gradually increased from the sidewall toward the bottom. Thus, when the surface of the silicon melt is lowered to around the round portion in the single-crystal silicon pulling process, variations in the pressure applied to the round portion by the silicon melt are reduced. This is because the curvature of the inner surface of the round portion does not significantly change. Therefore, waves are less likely to occur on the surface of the silicon melt at these junctions, which makes dislocations less likely to occur in the silicon single crystal.

Effects of the Invention

According to the present invention, buckling of the vitreous silica crucible or fall of the sidewall into the crucible can be effectively suppressed. Furthermore, dislocations in the silicon single crystal can be suppressed to enhance the yield of the single crystal.

DESCRIPTION OF THE PREFERRED EMBODIMENTS

Figure 1:
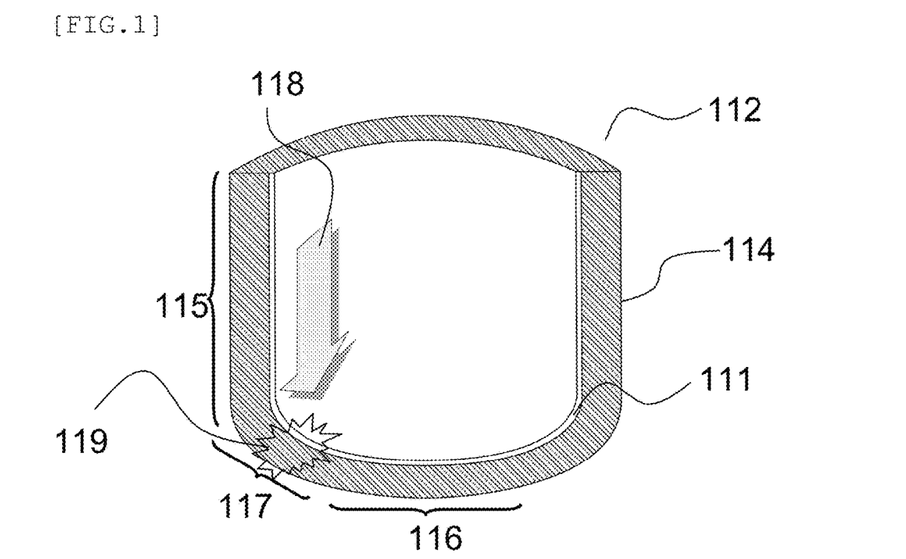
FIG. 1 is a sectional view showing the overall configuration of a vitreous silica crucible of an embodiment.

Hereafter, an embodiment of the present invention will be described with reference to the drawings. Like components are given like reference signs throughout the drawings and therefore description thereof will be omitted as appropriate.
Vitreous Silica Crucible FIG. 1 is a sectional view schematically showing the configuration of a vitreous silica crucible. A vitreous silica crucible 112 of the present embodiment includes an inner transparent vitreous silica layer 111 and an outer bubble-containing vitreous silica layer 114. When using the vitreous silica crucible 112 to pull single crystal silicon by the Czochralski method (CZ method) or the like, the vitreous silica crucible 112 is placed on a susceptor (not shown) in such a manner that an opening thereof is oriented upward.

The vitreous silica crucible 112 includes a round portion (may be referred to as "corner") 117 whose inner surface forms a transition curve in a section passing through the rotation axis of the vitreous silica crucible 112, a cylindrical sidewall 115 having an upward-opening rim, and a mortar-shaped bottom 116 including a straight line or a curve having a relatively small curvature. In the present embodiment, the round portion 117 connects the sidewall 115 and the bottom 116 and refers to a portion between the point at which a tangential line to the curve of the round portion 117 overlaps the sidewall 115 of the vitreous silica crucible 112 and the point at which the round portion 117 has a common tangential line with the bottom 116.

A method for producing single-crystal silicon by use of the vitreous silica crucible 112 includes the successive processes of: charging polycrystalline silicon into the vitreous silica crucible; heating and fusing the polycrystalline silicon to obtain a silicon melt; and pulling single-crystal silicon from the silicon melt.

In the vitreous silica crucible 112, the inner surfaces of the sidewall 115 and the bottom 116 are connected by the transition curve formed by the inner surface of the round portion 117 in the section passing through the rotation axis of the vitreous silica crucible 112 without any breakpoint. Therefore, when the surface of the silicon melt is lowered (as shown with an arrow 118) to around the round portion 117 in the single-crystal silicon pulling process, variations in the pressure applied to the round portion 117 (marked with a jagged circle 119) by the silicon melt are reduced. As a result, according to this configuration, buckling of the vitreous silica crucible 112 or fall of the sidewall 115 into the crucible can be effectively suppressed. Furthermore, in this production method, waves are less likely to occur on the surface of the silicon melt at the junctions, which makes dislocations less likely to occur in the silicon single crystal.

Preferably, the single-crystal silicon pulling process includes reducing the pulling speed of the single-crystal silicon from around the time point when the melt surface reaches the junction of the sidewall 115 and the round portion 117. Thus, when the surface of the silicon melt is lowered in the process of pulling single-crystal silicon from the silicon melt, waves are much less likely to occur on the surface of the silicon melt at the junction of the inner surfaces of the sidewall 115 and the round portion 117. Accordingly, dislocations are much less likely to occur in the single-crystal silicon.

As seen above, in the vitreous silica crucible 112, the round portion 117 is provided in such a manner that the curvature of the inner surface thereof is gradually (continuously or intermittently) increased from the sidewall 115 toward the bottom 116 in the section passing through the rotation axis of the vitreous silica crucible 112. That is, the curvature of the inner surface of the round portion 117 does not significantly change. Therefore, when the surface of the silicon melt is lowered in the single-crystal silicon pulling process, variations in the pressure applied to the round portion 117 by the silicon melt are reduced. As a result, according to this configuration, buckling of the vitreous silica crucible 112 or fall of the sidewall 115 into the crucible can be effectively suppressed. Furthermore, the curvature of the inner surface around the round portion 117 does not significantly change either. Therefore, when the surface of the silicon melt is lowered in the single-crystal silicon pulling process, variations in the pressure applied to the inner surface around the round portion 117 by the silicon melt are also reduced. As a result, in this production method, waves are less likely to occur on the surface of the silicon melt around the round portion 117, which makes dislocations less likely to occur in the silicon single crystal.

Figure 2:
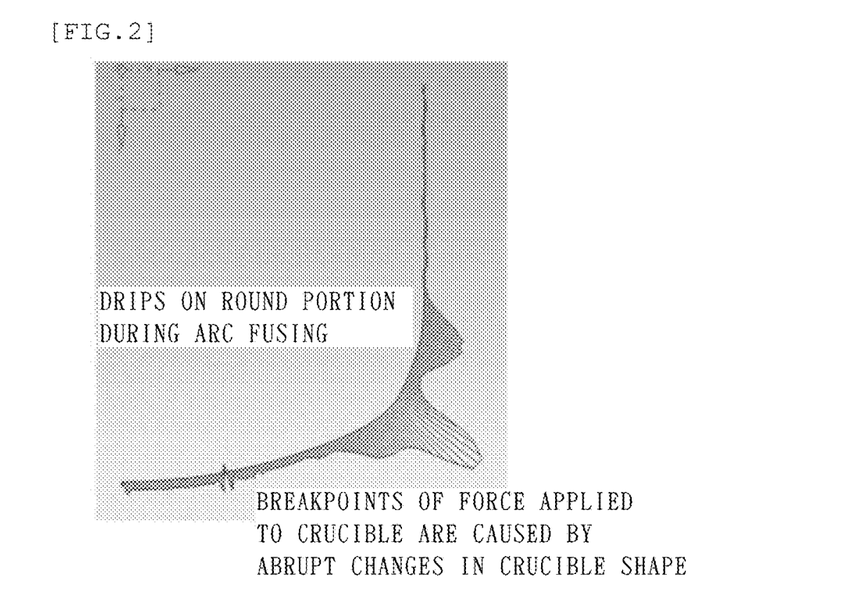
FIG. 2 is a sectional view obtained by actually measuring the inner surface shape of a traditional vitreous silica crucible and then visualizing the rate of change of the curvature formed by the inner surface shape.

FIG. 2 is a sectional view obtained by actually measuring the inner surface shape of a traditional vitreous silica crucible and then visualizing the rate of change of the curvature of the inner surface shape. As seen, the present inventors accurately measured the three-dimensional shape of the traditional vitreous silica crucible in the course of developing the vitreous silica crucible of the present invention. Then, by use of the measured values of the three-dimensional shape, the present inventors conducted an analysis on how the curvature of the curve of the inner surface changed in a section passing through the rotation axis of the vitreous silica crucible. As a result, the present inventors found that, in the traditional vitreous silica crucible, the curvature of the inner surface of the round portion 117 abruptly changed. The present inventors then assumed that the abrupt changes in the curvature is caused by use of a compound curve in the design drawing of the round portion of the traditional vitreous silica crucible. The present inventors also assumed that the abrupt changes in the curvature are also caused by the fact that, in the traditional vitreous silica crucible manufacturing process, vitreous silica dripped onto the round portion during arc-fusing and thus prevented the round portion from taking a shape according to the design.

Figure 3:
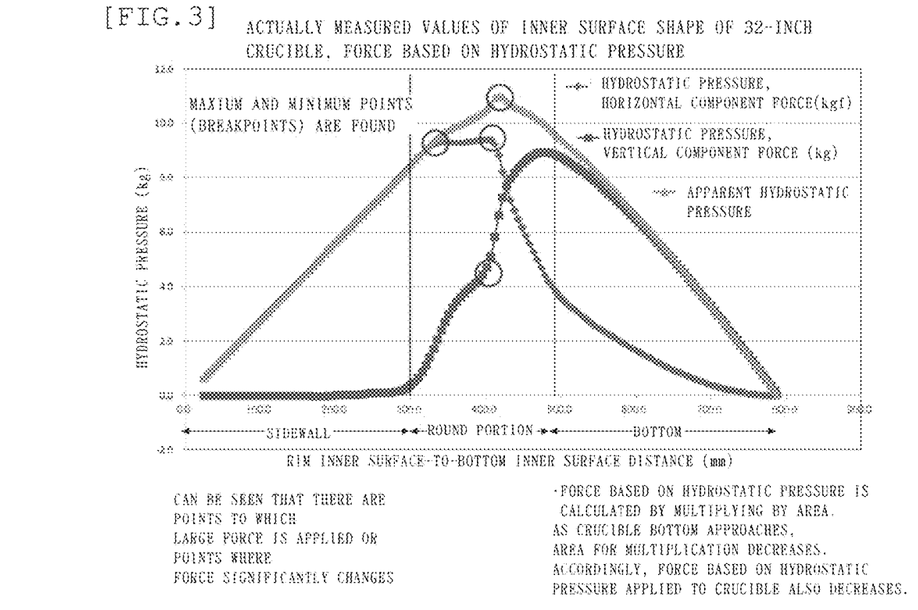
FIG. 3 is a graph showing results obtained by actually measuring the inner surface shape of the traditional vitreous silica crucible and then calculating the pressure based on hydrostatic pressure applied to the inner surface.

FIG. 3 is a graph showing results obtained by actually measuring the inner surface shape of the traditional vitreous silica crucible and then calculating the pressure based on hydrostatic pressure applied to the inner surface. The present inventors assumed that the abrupt changes in the curvature shown in FIG. 2 formed breakpoints of the force applied to the crucible and then calculated changes in hydrostatic pressure on the basis of the measured values of the inner surface shape of the 32-inch crucible as shown in FIG. 3. As a result, the present inventors found that both the horizontal and vertical component forces had maximum and minimum points around the round portion. That is, the present inventors found that points to which a large force was applied or points where a force significantly changed existed around the round portion.

In the field of vitreous silica crucibles, it has been common technical knowledge that the inner surface of the round portion is formed by a curve having a single curvature, as described in Patent Document 2. On the other hand, the present inventors found that, in the traditional vitreous silica crucible, the formation of the inner surface of the round portion by a curve having a single curvature caused buckling of the vitreous silica crucible 112 or fall of the sidewall 115 into the crucible. The present inventors also found that, in the traditional vitreous silica crucible, the formation of the inner surface of the round portion by a curve having a single curvature caused dislocations in the silicon single crystal. Then, based on these findings, the present inventors designed the vitreous silica crucible of the present invention.

Note that the inner surface of the round portion 117 actually has minute recesses and projections, small distortions, or the like in many cases. It is preferable to usually neglect local abrupt changes in curvature caused by such minute recesses or projections, small distortions, or the like. Specifically, it is preferable to recognize the inner surface of the round portion 117 as a moving average line obtained by smoothing the length of the curve by moving averages at intervals of 10 mm in the section passing through the rotation axis of the vitreous silica crucible 112. Thus, it is possible to neglect the local abrupt changes in the curvature caused by minute recesses and projections, small distortions, or the like and thus to confirm that the curvature of the inner surface of the round portion 117 is gradually increased from the sidewall 115 toward the bottom 116 in broad outline. The interval at which moving averages are obtained is not limited to 10 mm and may be, for example, any of 1 mm, 2 mm, 3 mm, 4 mm, 5 mm, 6 mm, 7 mm, 8 mm, 9 mm, 10 mm, 15 mm, 20 mm, 25 mm, 30 mm, 40 mm, 50 mm, 60 mm, 70 mm, 80 mm, 90 mm, and 100 mm.

Preferably, the difference between the curvatures at the boundary between the inner surfaces of the sidewall 115 and the round portion 117 in the section passing through the rotation axis of the vitreous silica crucible 112 is $1/300$ mm or less. As this curvature difference is smaller, abrupt variations in pressure are less likely to occur around the boundary. As a result, it is possible to suppress abrupt changes in the pressure applied to the sidewall 115 or round portion 117 around this boundary and thus to suppress buckling of the vitreous silica crucible or fall of the sidewall 115 into the crucible. The curvature difference may be not more than any of $1/300$ mm, $1/400$ mm, $1/500$ mm, $1/600$ mm, $1/700$ mm, $1/800$ mm, $1/900$ mm, $1/1000$ mm, $1/2000$ mm, $1/3000$ mm, $1/4000$ mm, $1/5000$ mm, $1/6000$ mm, $1/7000$ mm, $1/8000$ mm, $1/9000$ mm, and $1/10000$ mm, or may be between any two values thereof.

Preferably, the difference between the curvatures at the boundary between the inner surfaces of the round portion 117 and the bottom 116 in the section passing through the rotation axis of the vitreous silica crucible 112 is $1/300$ mm or less. As this curvature difference is smaller, abrupt changes in pressure are less likely to occur around the boundary when the melt surface is lowered. As a result, it is possible to suppress abrupt changes in the pressure applied to the round portion 117 or bottom 116 around this boundary and thus to suppress buckling of the vitreous silica crucible or fall of the sidewall 115 into the crucible. The curvature difference may be not more than any of $1/300$ mm, $1/400$ mm, $1/500$ mm, $1/600$ mm, $1/700$ mm, $1/800$ mm, $1/900$ mm, $1/1000$ mm, $1/2000$ mm, $1/3000$ mm, $1/4000$ mm, $1/5000$ mm, $1/6000$ mm, $1/7000$ mm, $1/8000$ mm, $1/9000$ mm, and $1/10000$ mm, or may be between any two values thereof.

The transition curve of the round portion 117 is not limited to a particular kind of transition curve but preferably includes one or more kinds of curves selected from the group consisting of a clothoid curve, a cubic curve, and a sine half-wavelength diminishing curve. The three kinds of transition curves have characteristics as shown in Table 1 below.

TABLE 1

Kinds of Transition Curve

| | Definition | Smoothness of connection with bottom (rate of change of radius) | Smoothness of connection with sidewall (rate of change |
|---|---|---|---|
| Cubic curve (cubic parabolic curve) | Relationship between height direction x and width direction y is cubic | Since rate of change of radius = 0, very smooth (radius is same as bottom). | Although rate of change of radius ≠ 0, radius is ∞. Therefore, roughly |
| Clothoid curve | Curvature (=1/radius) changes in proportion to travelled distance | Although rate of change of radius ≠ 0, radius is same as bottom. Therefore, roughly | Although rate of change of radius ≠ 0, radius is ∞. Therefore, roughly |
| Sine half-wavelength diminishing curve | Curvature (=1/radius) changes in sine form with respect to travelled | Since rate of change of radius = 0, very smooth (radius is same as bottom). | Since rate of change of radius = 0, very smooth (radius is ∞). |

Figure 4:
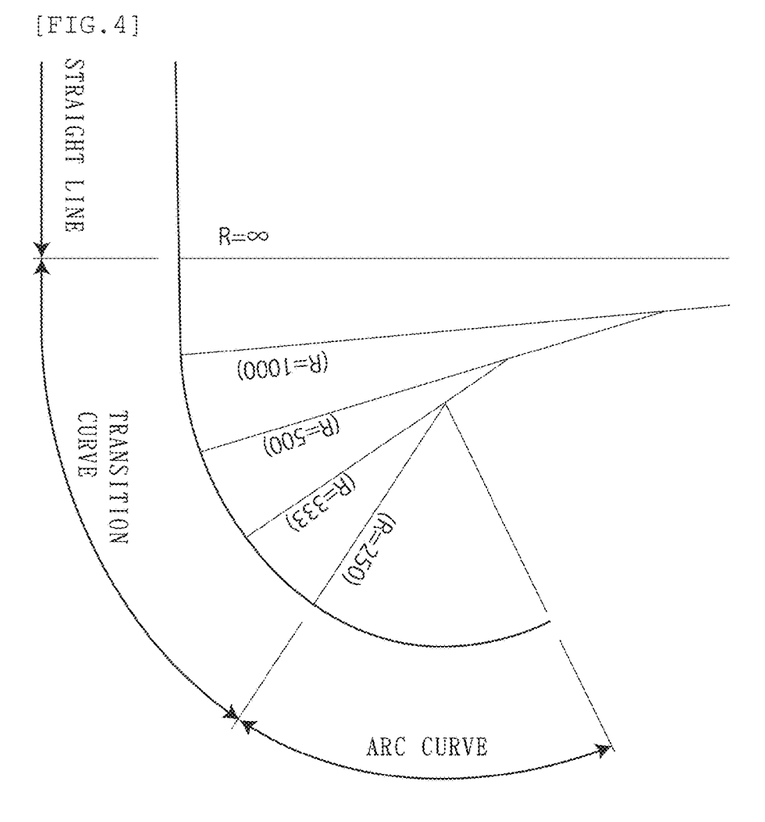
FIG. 4 is a sectional view showing a transition curve formed by the inner surface of the round portion of the vitreous silica crucible of the present embodiment.

FIG. 4 is a sectional view showing a transition curve formed by the inner surface of the round portion of the vitreous silica crucible of the present embodiment. As shown in FIG. 4, the inner surfaces of the linear (R=∞) sidewall 15 and the arc curve-shaped (R=250 mm) bottom 116 are connected by the transition curve formed by the inner surface of the round portion 117 (the radius of curvature continuously changes like R=∞, R=1000 mm, R=500 mm, R=333 mm, and R=250 mm) without breakpoints.

Thus, when the surface of the silicon melt is lowered in the single-crystal silicon pulling process, variations in the pressure applied to the inner surface around the round portion 117 by the silicon melt are reduced. As a result, according to this configuration, buckling of the vitreous silica crucible 112 or fall of the sidewall 115 into the crucible can be effectively suppressed. Furthermore, when the surface of the silicon melt is lowered in the single-crystal silicon pulling process, abrupt changes in the pressure are less likely to occur around the round portion 117. As a result, according to this production method, it is possible to suppress dislocations in the silicon single crystal when the melt surface is lowered to around the round portion 117.

Note that in the present invention, the inner surface of the round portion 117 does not need to be a mathematically perfect transition curve in the section passing through the rotation axis of the vitreous silica crucible 112. The reason is as follows: in practice, a vitreous silica crucible 112 where the inner surfaces of the sidewall 115 and the bottom 116 are connected by the transition curve formed by the inner surface of the round portion 117 without breakpoints is designed by use of a CAD system or the like; then by use of this CAD data, CAD data of a carbon mold for manufacturing a vitreous silica crucible is designed; then, a carbon mold is manufactured based on the CAD data; at this time, however, some manufacturing errors occur; then, a vitreous silica crucible 112 is manufactured by use of the carbon mold; at this time, however, some manufacturing errors occur as well; and thus the inner surface of the round portion 117 is less likely to form a mathematically perfect transition curve and often takes a slightly different shape from the CAD data in a section passing through the rotation axis of the actually manufactured vitreous silica crucible 112.

Preferably, the maximum error of the shape of the vitreous silica crucible of the present embodiment is within ±1 mm of the ideal shape in the CAD data. The maximum error may be not more than any value of 0.01 mm, 0.02 mm, 0.03 mm, 0.04 mm, 0.05 mm, 0.06 mm, 0.07 mm, 0.08 mm, 0.09 mm, 0.10 mm, 0.20 mm, 0.30 mm, 0.40 mm, 0.50 mm, 0.60 mm, 0.70 mm, 0.80 mm, 0.90 mm, 1.00 mm, 2.00 mm, 3.00 mm, 4.00 mm, 5.00 mm, 6.00 mm, 7.00 mm, 8.00 mm, 9.00 mm, 10.00 mm, and 11.00 mm, or may be between any two values thereof. As long as the maximum error satisfies any of these conditions, the inner surfaces of the linear sidewall 115 and the arc curve-shaped bottom 116 can be properly connected by a dynamically reasonable structure without breakpoints. Furthermore, when the surface of the silicon melt is lowered to around the round portion 117 in the vitreous silica crucible 112, variations in the pressure applied to the inner surface around the round portion 117 by the silicon melt are advantageously reduced.

Furthermore, preferably, the outer surfaces of the sidewall 115 and the bottom 116 are connected by a transition curve formed by the outer surface of the round portion 117 without breakpoints in the section passing through the rotation axis of the vitreous silica crucible 112. This is because the CAD data of the carbon mold is designed so as to fit the CAD data of the outer surface of the vitreous silica crucible 12. Therefore, the CAD data of the outer surface of the round portion 117 of the vitreous silica crucible 12 preferably forms a transition curve so that the inner surface of the round portion of a carbon mold manufactured on the CAD data thereof forms a curve approximate to a transition curve. If the inner surface of the round portion of the carbon mold forms a curve approximate to an transition curve, the inner surface of the round portion 117 of a vitreous silica crucible obtained by depositing natural quartz powder and synthetic silica powder on the inner surface of the carbon mold and arc-fusing them also forms a curve approximate to a transition curve.

While the embodiment of the present invention has been described with reference to the drawings, the embodiment is illustrative only. Various configurations other than those described above can be employed.

DESCRIPTION OF REFERENCE SIGNS

For example, in the above embodiment, the curve formed by the inner surface of the round portion 117 whose curvature is gradually increased from the sidewall 115 toward the bottom 116 in the section passing through the rotation axis of the vitreous silica crucible 112 has been described as being a transition curve. However, the curve is not limited to a transition curve. For example, the curve formed by the inner surface of the round portion 117 may be a compound curve where curves having multiple curvatures are connected. Even in this case, the curvature of the inner surface of the round portion 117 is intermittently increased from the sidewall 115 toward the bottom 116. Thus, functions and effects similar to those in the above embodiment are obtained. Such a compound curve may be a compound curve where curves having the number of different curvatures greater than or equal to any of 2, 3, 4, 5, 6, 7, 8, 9, 10, 20, 30, 40, 50, 60, 70, 80, 90, and 100 are connected together, or may be a compound curve where curves having the number of different curvatures, the number being between any two values thereof, are connected together. As the number of different curvatures of the connected curves is greater, the curvature is advantageously more gradually increased.

DESCRIPTION OF REFERENCE SIGNS 10 vitreous silica crucible
11 curved portion
12 straight body portion
13 bottom
R1 curvature of inner surface of curved portion
R2 curvature of inner surface of bottom
M1 center of curvature of curved portion
M2 center of curvature of bottom
W thickness of curved portion
111 transparent vitreous silica layer
112 vitreous silica crucible
114 bublle-containing vitreous silica layer
115 sidewall
116 bottom
117 round portion

The invention claimed is:
1. A vitreous silica crucible used to pull single-crystal silicon, comprising, comprising:
    a cylindrical sidewall having an upward-opening rim, said sidewall having an inner surface and an outer surface:
    a mortar-shaped bottom including a curve in a cross section passing through a rotation axis of the vitreous silica crucible, said bottom having an inner surface and an outer surface: and
    a round portion connecting the sidewall and the bottom, said round portion having an inner surface and an outer surface, wherein
    the round portion is provided in such a manner that the inner surface of the sidewall and the inner surface of the bottom are connected by a transition curve formed by the inner surface of the round portion, wherein the transition curve of the inner surface thereof is defined by at least three curvatures increased from the sidewall toward the bottom in a cross section passing through the rotation axis of the vitreous silica crucible, and the at least three curvatures of the inner surface of the round portion change smoothly from one curvature to another curvature in a manner that a difference between the one curvature and the another curvature is $\frac{1}{300}$ mm or less, and
    the outer surface of the sidewall and the outer surface of the bottom are connected by a transition curve formed by the outer surface of the round portion, wherein the transition curve of the outer surface of the round portion is defined by a plurality of curvatures in a cross section passing through the rotation axis of the vitreous silica crucible, and the plurality of curvatures of the outer surface of the round portion change smoothly from one curvature to another curvature.

2. The vitreous silica crucible of claim 1, wherein the transition curve comprises one or more kinds of curves selected from the group consisting of a clothoid curve, a cubic curve, and a sine half-wavelength diminishing curve.

* * * * *